United States Patent
Wang et al.

(10) Patent No.: US 7,485,480 B2
(45) Date of Patent: Feb. 3, 2009

(54) METHOD OF MANUFACTURING HIGH POWER LIGHT-EMITTING DEVICE PACKAGE AND STRUCTURE THEREOF

(75) Inventors: Bily Wang, Hsin Chu (TW); Jonnie Chuang, Pan Chiao (TW); Shih-Yu Wu, Pan Chiao (TW)

(73) Assignee: Harvatek Corporation, Hsin Chu (TW)

( * ) Notice: Subject to any disclaimer, the term of this patent is extended or adjusted under 35 U.S.C. 154(b) by 258 days.

(21) Appl. No.: 11/524,462

(22) Filed: Sep. 21, 2006

(65) Prior Publication Data

US 2008/0073662 A1    Mar. 27, 2008

(51) Int. Cl.
 *H01L 21/00* (2006.01)
(52) U.S. Cl. .......................... 438/26; 438/116
(58) Field of Classification Search ................. 438/116, 438/26

See application file for complete search history.

(56) References Cited

U.S. PATENT DOCUMENTS

2002/0004251 A1 * 1/2002 Roberts et al. ................ 438/26

\* cited by examiner

*Primary Examiner*—Thanh V Pham
*Assistant Examiner*—Caleb Henry
(74) *Attorney, Agent, or Firm*—Rosenberg, Klein & Lee

(57) ABSTRACT

A method of manufacturing high power light-emitting device packages and structure thereof, wherein the method thereof includes the steps of: (a) forming a plurality of lead frames, each of the lead frames includes a heat-dissipating element and a plurality of leads; (b) electroplating an outer surface of the lead frames each; (c) coating conductive gel on a surface of the heat-dissipatings each; (d) arranging at least one light-emitting chip on the conductive gel; (e) forming an encapsulant on each of the lead frames; (f) connecting at least one top electrode of the light-emitting chip with one of the leads; (g) coating silicon gel for covering the at one light-emitting chip, and forming integrally a focusing light convex surface on a top surface of the silicon gel; and (h) cutting off the tie-bars to separate the lead frames from one another, whereby forming a plurality of high power light-emitting device packages.

10 Claims, 9 Drawing Sheets

METHOD OF MANUFACTURING HIGH POWER LIGHT-EMITTING DEVICE PACKAGE AND STRUCTURE THEREOF

BACKGROUND OF THE INVENTION

1. Field of the Invention

The present invention relates to a method of manufacturing high power light-emitting device packages and structure thereof, and more particularly to a method of manufacturing high power LED package and structure thereof.

2. Description of the Prior Art

Reference is made to FIG. 1, which is a schematic view of a light-emitting chip package structure according to the prior art. A light-emitting chip 10a is arranged on a first metal substrate 11a, and a surface electrode of the light-emitting chip 10a is electrically connected on a second metal substrate 12a by a solder wire 13a. The first metal substrate 11a is electrically connected in contract way with a bottom electrode of the light-emitting chip 10a. A transparent colloid 14a is packaged to a portion of the first metal substrate 11a and a portion of the second metal substrate 12a for protecting the light-emitting chip 10a and the solder wire 13a. The first metal substrate 11a and the second metal substrate 12a are separately two extended electrodes of the light-emitting chip 10a, and two bottom surfaces of the first metal substrate 11a and the second metal substrate 12a are welding surfaces for surface mounting on the external substrates.

However, because package of the light-emitting chip is fixed on the external substrate by means of surface mounting, light emitting direction is only perpendicular to the substrate.

Furthermore, the package of the light-emitting chip doesn't provide a heat-dissipating function. Because of the limits of material characteristics and packaging technologies, the light-emitting devices can't achieve specification in brightness and use life same as the general light sources. One of the important reasons is heat produced during the light-emitting devices are operated. Hence, the light-emitting devices with bad heat-dissipating design can cause high temperature to reduce brightness and use life.

The inventor of the present invention recognizes the above shortage should be corrected and special effort has been paid to research this field. The present invention is presented with reasonable design and good effect to resolve the above problems.

SUMMARY OF THE INVENTION

It is a primary object of the present invention to provide a method of manufacturing high power light-emitting device packages and structure thereof, wherein the structure of the high power light-emitting device packages has a heat-dissipating function and an adjustment of light emitting direction.

For achieving the objectives stated above, the other method of manufacturing high power light-emitting device packages comprises the steps of: (a) forming a plurality of lead frames on a metal strip, the lead frames are mutually connected by tie-bars, each of the lead frames includes a heat-dissipating element and a plurality of leads, and each of the leads is outwardly extended from one side of the heat-dissipating element; (b) electroplating each of outer surface of the lead frames each; (c) coating conductive gel on a surface of the heat-dissipating element of the lead frames each; (d) arranging at least one light-emitting chip on the conductive gel so that one bottom electrode of the light-emitting chip electrically connected with the surface of the heat-dissipating element; (e) forming an encapsulant on each of the lead frames by means of injection molding and the encapsulant covered on a portion of the heat-dissipating element and a portion of the leads each, a reflector cup integrally formed on the encapsulant and a reflective surface formed on an inner side wall thereof, and the at least one light-emitting chip exposed on a bottom of the reflector cups each; (f) connecting at least one top electrode of the light-emitting chip with one of the leads by means of wire-bonding; (g) coating silver epoxy at wire-bonding connections; (h) coating silicon gel inside each of the reflector cups and forming integrally a focusing light convex surface on a top surface of the silicon gel; and (i) cutting off the tie-bars to separate the lead frames from one another, whereby forming a plurality of high power light-emitting device packages.

In a preferred embodiment, wherein the step (e) further comprises: plating a reflective layer on each of the reflective surfaces.

Further, in other preferred embodiments, wherein the step (h) after coating silicon gel inside each of the reflector cups, a lens is pressed on a top of the reflector cups each.

Furthermore, in other preferred embodiments, wherein the step (h) that it is only coating silicon gel inside each of the reflector cups.

For achieving the objectives stated above, the structure of high power light-emitting device packages comprises a lead frame has a heat-dissipating element and a plurality of leads, and each of the leads is outwardly extended from one side of the heat-dissipating element; an electroplating layer formed on an outer surface of the lead frames each; a conductive gel layer coated on a surface of the heat-dissipating element; at least one light-emitting chip disposed on the conductive gel layer so that one bottom electrode of the light-emitting chip electrically connected with the surface of the heat-dissipating element; an encapsulant covered on a portion of the heat-dissipating element and a portion of the leads each, a reflector cup integrally formed on the encapsulant and a reflective surface formed on an inner side wall thereof, and the at least one light-emitting chip exposed on a bottom of the reflector cups each; a solder wire electrically connected with at least one top electrode of the light-emitting chip to one of the leads; a silver epoxy layer formed on a connection location of the solder wire and the at least one top electrodes of the light-emitting chip, and on a connection location of the solder wire and the one of the leads; and a silicon gel layer formed inside the reflector cups for covering at least one light-emitting chip and the solder wire, whereby forming a plurality of high power light-emitting device packages.

Wherein the structure of the high power light-emitting device packages has a heat-dissipating function and an adjustment of light emitting direction are separately provided from the heat-dissipating element and the leads are extended from one side of the heat-dissipating element.

In the preferred embodiment, the structure of high power light-emitting device packages further comprises a reflective layer formed on the reflective surface.

Further, the structure of high power light-emitting device packages further comprises a lens is disposed on a top of the reflector cups each and is connected with the silicon gel layer.

Furthermore, in other preferred embodiments, wherein the silicon gel layer is directly formed inside the reflector cups.

For achieving the objectives stated above, the other method of manufacturing high power light-emitting device packages comprises the steps of: (a) forming a plurality of lead frames on a metal strip, the lead frames are mutually connected by tie-bars, each of the lead frames includes a heat-dissipating element and a plurality of leads, and each of the leads is outwardly extended from one side of the heat-dissipating element; (b) forming an encapsulant on each of the lead frames by means of injection molding and the encapsulant is covered on a portion of the heat-dissipating element and a portion of the leads each, a reflector cup is formed on the encapsulant and a reflective surface is formed on an inner side wall thereof, and a partial surface of the heat-dissipating element and a partial surface of the leads each are exposed on a bottom of the reflector cups each; (c) electroplating each of uncovered surface by the encapsulant of the lead frames each; (d) coating conductive gel on a bottom of the reflector cup; (e) arranging at least one light-emitting chip on the conductive gel so that one bottom electrode of the light-emitting chip is electrically connected with a surface of the heat-dissipating element; (f) connecting at least one top electrode of the light-emitting chip with one of the leads by means of wire-bonding; (g) coating silver epoxy at wire-bonding connections; (h) coating silicon gel inside each of the reflector cups and forming integrally a focusing light convex surface on a top surface of the silicon gel; and (i) cutting off the tie-bars to separate the lead frames from one another, whereby forming a plurality of high power light-emitting device packages.

In a preferred embodiment, wherein the step (b) further comprises: plating a reflective layer on each of the reflective surfaces.

Further, in other preferred embodiments, wherein the step (h) further comprises: after coating silicon gel inside each of the reflector cups, a lens is pressed on a top of the reflector cups each.

Furthermore, in other preferred embodiments, wherein the step (h) that it is only coating silicon gel inside each of the reflector cups.

For achieving the objectives stated above, the structure of high power light-emitting device packages comprises a lead frame has a heat-dissipating element and a plurality of leads, and each of the leads is outwardly extended from one side of the heat-dissipating element; an encapsulant is covered on a portion of the heat-dissipating element and a portion of the leads each, a reflector cup is formed on the encapsulant and a reflective surface is formed on an inner side wall thereof, and a partial surface of the heat-dissipating element and a partial surface of the leads each are exposed on a bottom of the reflector cups each; an electroplating layer is formed on each of uncovered surface of the lead frames each; a conductive gel layer is coated on the bottom of the reflector cups; at least one light-emitting chip is disposed on the conductive gel layer so that one bottom electrode of the light-emitting chip is electrically connected with a surface of the heat-dissipating element; a solder wire is electrically connected with at least one top electrode of the light-emitting chip to one of the leads; a silver epoxy layer is formed on a connection location of the solder wire and the at least one top electrode of the light-emitting chip, and on a connection location of the solder wire and the one of the leads; and a silicon gel layer is formed inside the reflector cups for covering at least one light-emitting chip and the solder wire, and a focusing light convex surface is integrally formed on a top surface of the silicon gel, whereby forming a plurality of high power light-emitting device packages.

Wherein the structure of the high power light-emitting device packages has a heat-dissipating function and an adjustment of light emitting direction are separately provided from the heat-dissipating element and the leads are extended from one side of the heat-dissipating element.

In the preferred embodiment, the structure of high power light-emitting device packages further comprises a reflective layer formed on the reflective surface.

Further, the structure of high power light-emitting device packages further comprises a lens is disposed on a top of the reflector cups each and is connected with the silicon gel layer.

Furthermore, in other preferred embodiments, wherein the silicon gel layer is directly formed inside the reflector cups.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The above and further advantages of this invention may be better understood by referring to the following description, taken in conjunction with the accompanying drawings, in which.

The drawings will be described further in connection with the following detailed description of the present invention.

DETAILED DESCRIPTION OF THE PREFERRED EMBODIMENTS

Figure 1:
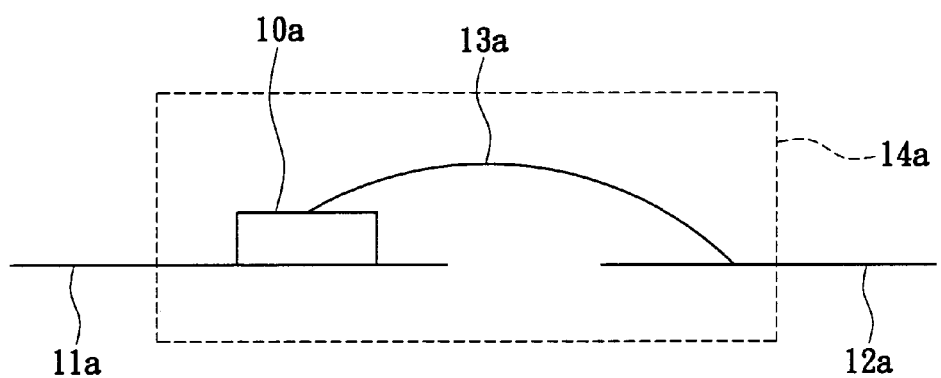
FIG. 1 is a schematic view of a light-emitting chip package structure according to the prior art.
Figure 2:
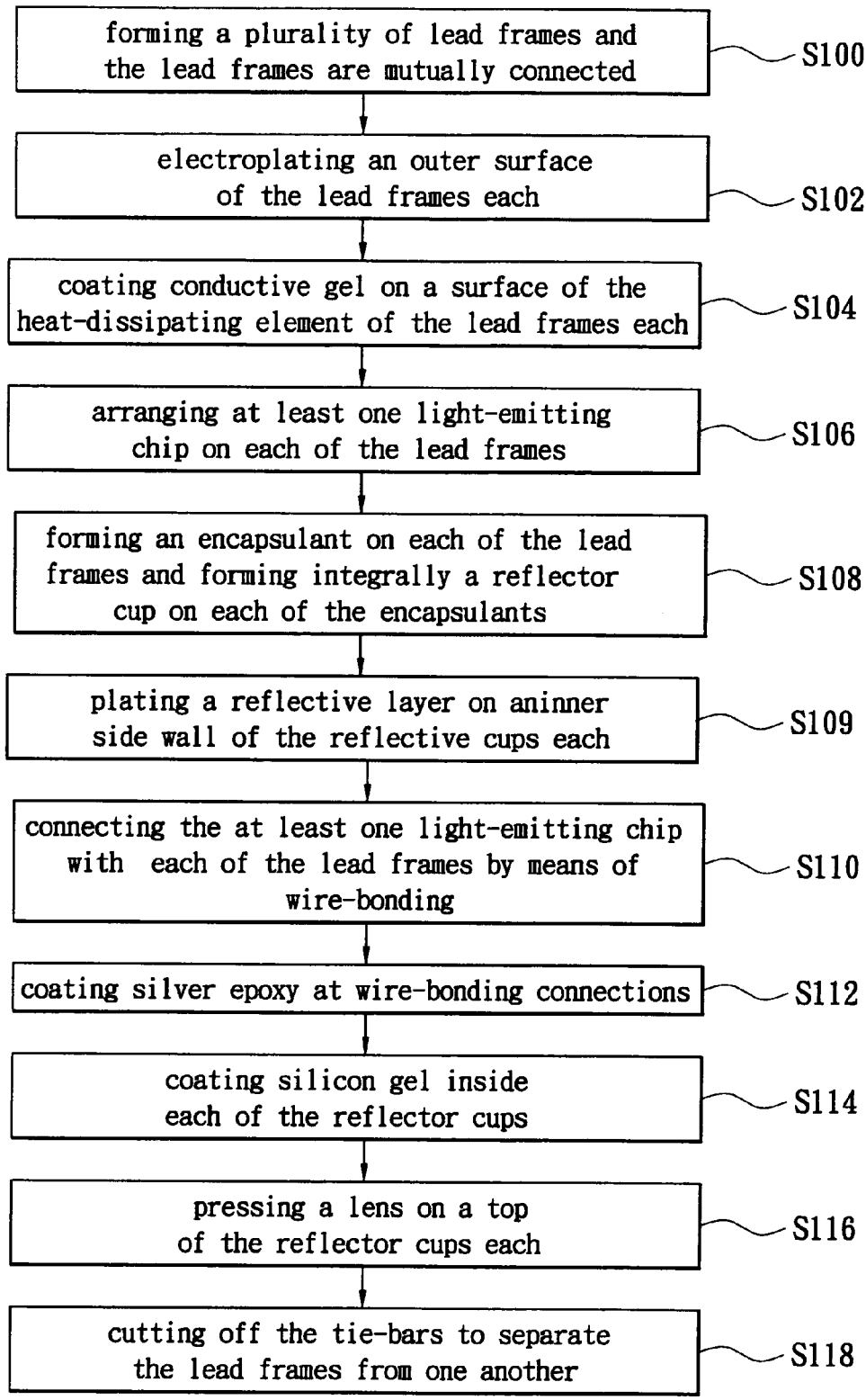
FIG. 2 is a first manufacturing flowchart of a preferred embodiment according to the present invention.
Figure 3:
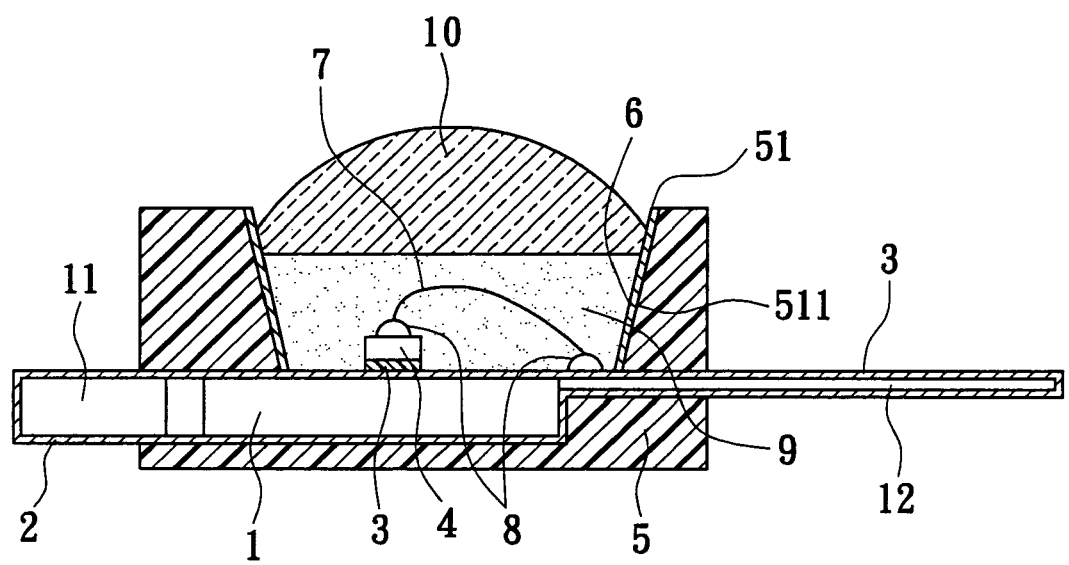
FIG. 3 is a cross-sectional view of a first preferred embodiment according to the present invention.
Figure 4:
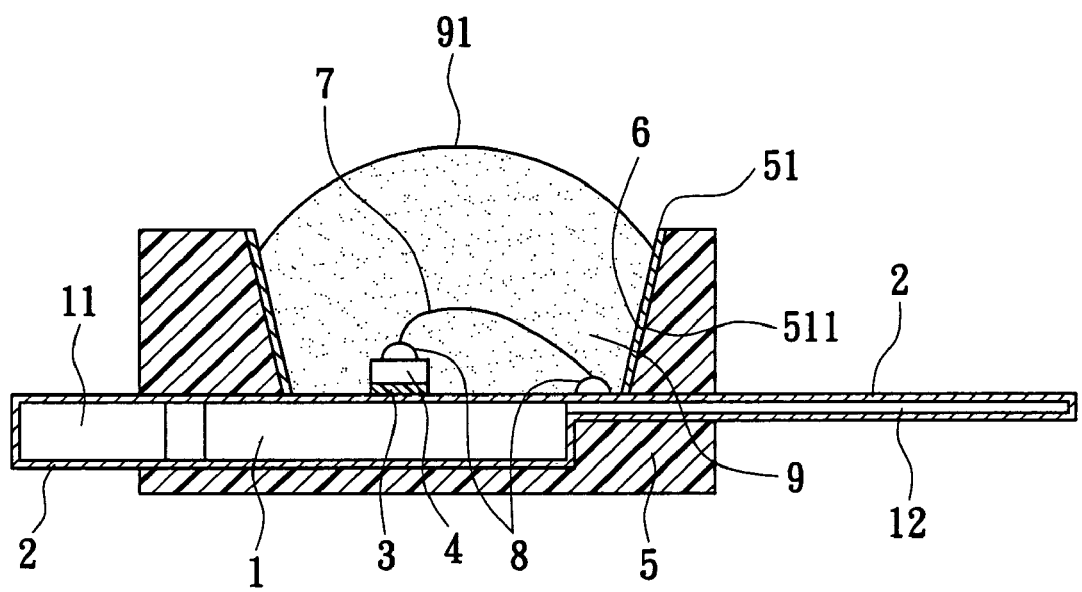
FIG. 4 is a cross-sectional view of a second preferred embodiment according to the present invention.
Figure 5:
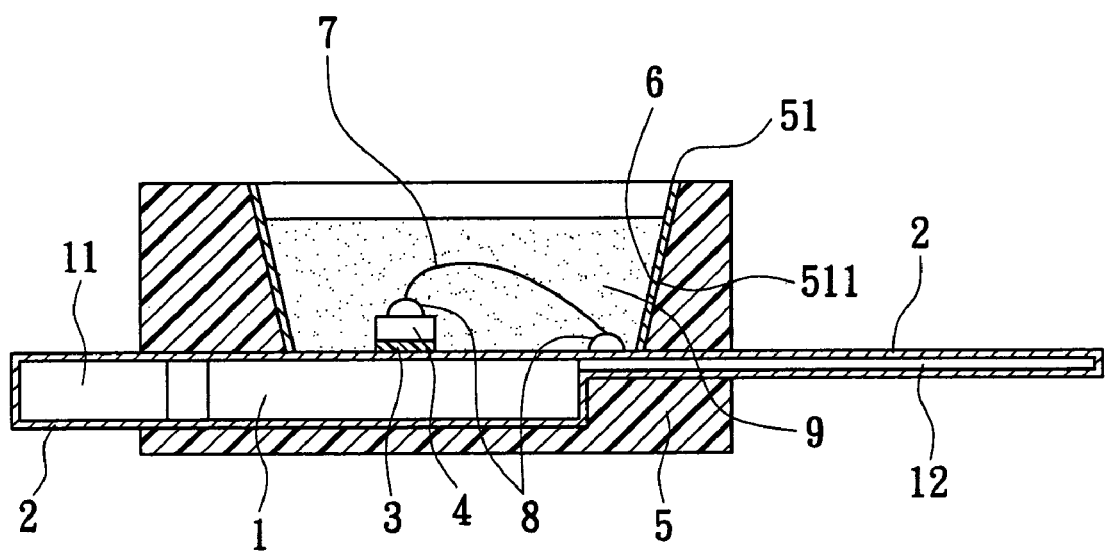
FIG. 5 is a cross-sectional view of a third preferred embodiment according to the present invention.

Reference is made to FIG. 2 which is a first manufacturing flowchart of a preferred embodiment according to the present invention, and references are made from FIG. 3 to FIG. 5 which are separately cross-sectional views of a first preferred embodiment to a third preferred embodiment according to the present invention. A method of manufacturing high power light-emitting device packages and structure thereof, wherein the method of manufacturing high power light-emitting device packages comprises the steps of: forming a plurality of lead frames and the lead frames are mutually connected (S100); electroplating an outer surface of the lead frames each (S102); coating conductive gel on a surface of the heat-dissipating element of the lead frames each (S104); arranging at least one light-emitting chip inside each of the lead frames (S106); forming an encapsulant on each of the lead frames and forming integrally a reflector cup on each of the encapsulants (S108); connecting the at least one light-emitting chip with each of the lead frames by means of wire-bonding (S110); coating silver epoxy at wire-bonding connections (S112); coating silicon gel inside each of the reflector cups (S114); pressing a lens on a top of the reflector cups each (S116); and cutting off the tie-bars to separate the lead frames from one another (S118). It can be seen in the following detailed description:

First, a plurality of lead frames are formed on a metal strip with good electric conductivity and good heat conduction, and the lead frames are mutually connected by tie-bars. As shown in FIG. 3 to FIG. 5, wherein each of the lead frames 1 includes a heat-dissipating element 11 and a plurality of leads 12, and each of the leads 12 is extended outwardly from one side of the heat-dissipating element 11 (S100).

Next, electroplating a layer of metal on each of outer surface of the lead frames 1 each to form an electroplating layer 2 (S102);

Next, coating conductive gel on a top surface of the heat-dissipating element 11 of the lead frames 1 each to form a conductive gel layer 3 (S104);

Next, arranging at least one light-emitting chip 4 on each of the conductive gel layer 3 so that one bottom electrode of the light-emitting chip 4 electrically connected on the surface of the heat-dissipating element 11 (S106);

Next, forming an encapsulant 5 on each of the lead frames 1 by means of injection molding and the encapsulant 5 covered on a portion of the heat-dissipating element 11 and a portion of the leads 12 each, and a reflector cup 51 integrally formed on the encapsulant 5 and a reflective surface 511 formed on an inner side wall thereof, and the at least one light-emitting chip 4 exposed on a bottom of the reflector cups 51 each (S108);

Next, at least one top electrode of the light-emitting chip 4 is connected with one of the leads 12 by a solder wire 7 (S110).

Next, a connection location of the solder wire 7 and the at least one top electrodes of the light-emitting chip 4, and a connection location of the solder wire 7 and the one of the leads 12 are coated by silver epoxy to form a silver epoxy layer 8 for fixing the solder wire 7 (S112).

Next, each of the reflector cups 51 is coated silicon gel therein to form a silicon gel layer 9 (shown in FIG. 3) for covering the light-emitting chip 4 and the solder wire 7 (S114).

Next, a lens 10 is pressed on a top opening of the reflector cups 51 each, and the lens 10 has a focusing-light function to enhance light emitting brightness (S116).

Finally, the tie-bars are cut off to separate the lead frames 1 from one another so as to form a plurality of high power light-emitting device packages (S118).

The method of manufacturing high power light-emitting device packages stated above, wherein the step (S108) further comprises: a reflective layer 4 is plated on each of the reflective surfaces 511 (S109).

Further, in the step (S114), the silicon gel is coated inside each of the reflector cups 51 and a focusing light convex surface 91 is integrally formed on a top surface of the silicon gel (shown in FIG. 4), wherein the focusing light convex surface 91 has a focusing-light function to enhance light emitting brightness.

Furthermore, in the step (S114), the silicon gel is coated inside each of the reflector cups 51 to form a silicon gel layer 9 (shown in FIG. 5), wherein the silicon gel layer 9 has a transmitting-light function as a lens.

As shown in FIG. 3, according to the method of manufacturing stated above for manufacturing an structure of high power light-emitting device packages of the first preferred embodiment comprises a lead frame 1, an electroplating layer 2, a conductive gel layer 3, a light-emitting chip 4, an encapsulant 5, a reflective layer 6, a solder wire 7, a silver epoxy layer 8, a silicon gel layer 9 and a lens 10.

The lead frame 1 includes a heat-dissipating element 11 and a plurality of leads 12, and each of the leads 12 is extended outwardly from one side of the heat-dissipating element 11. The electroplating layer 2 is formed on an outer surface of the lead frame of the lead frames 1 each. The conductive gel layer 3 is coated on a top surface of the reflector cup 11 of the lead frames 1 each for fixing the light-emitting chip 4. The light-emitting chip 4 is disposed on the conductive gel layer 3 so that a bottom electrode of the light-emitting chip 4 is electrically connected with a top surface of the heat-dissipating element 11. The encapsulant 5 is covered on a portion of the heat-dissipating element 11 and a portion of the leads 12 each, a reflector cup 51 is formed on the encapsulant 5 and a reflective surface 511 is formed on an inner side wall thereof, and the light-emitting chip 4 is exposed on a bottom of the reflector cups 51. The reflective layer 6 is formed on the reflective surface 511. The solder wire 7 is electrically connected with a top electrode of the light-emitting chip 4 to one of the leads 12. The silver epoxy layer 8 is formed on a connection location of the solder wire 7 and the top electrode of the light-emitting chip 4, and on a connection location of the solder wire 7 and the one of the leads 12. The silicon gel layer 9 is formed inside the reflector cups 21 for covering the light-emitting chip 4 and the solder wire 7. The lens 10 is disposed on a top of the reflector cups 51 each and connected with a top surface of the silicon gel layer 9.

Further, in the second preferred embodiment as shown in FIG. 4, the silicon gel is coated inside each of the reflector cups 51 and a focusing light convex surface 91 is integrally formed on a top surface of the silicon gel layer 9 so that light passed through the focusing light convex surface 91 and focused to enhance light emitting brightness.

Furthermore, in the third preferred embodiment as shown in FIG. 5, the silicon gel is coated inside each of the reflector cups 51 to form a silicon gel layer 9, wherein the silicon gel layer 9 has transmitting-light function.

Figure 6:
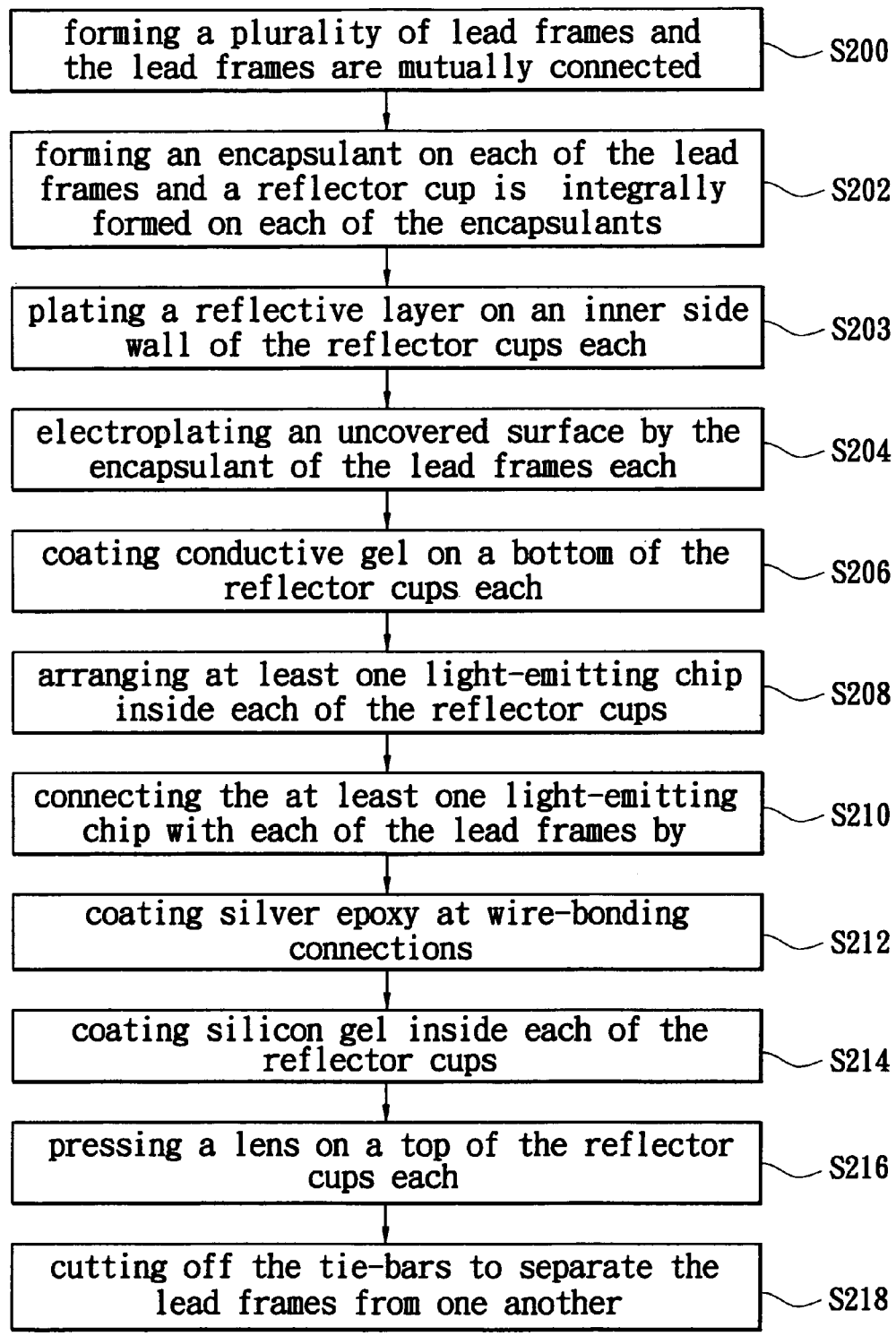
FIG. 6 is a second manufacturing flowchart of a preferred embodiment according to the present invention.
Figure 7:
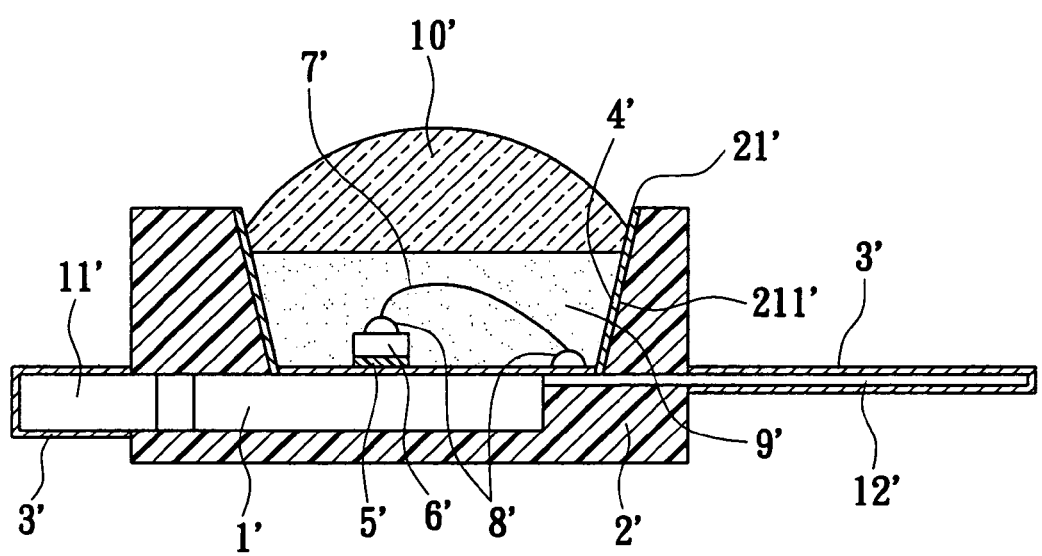
FIG. 7 is a cross-sectional view of a fourth preferred embodiment according to the present invention.
Figure 8:
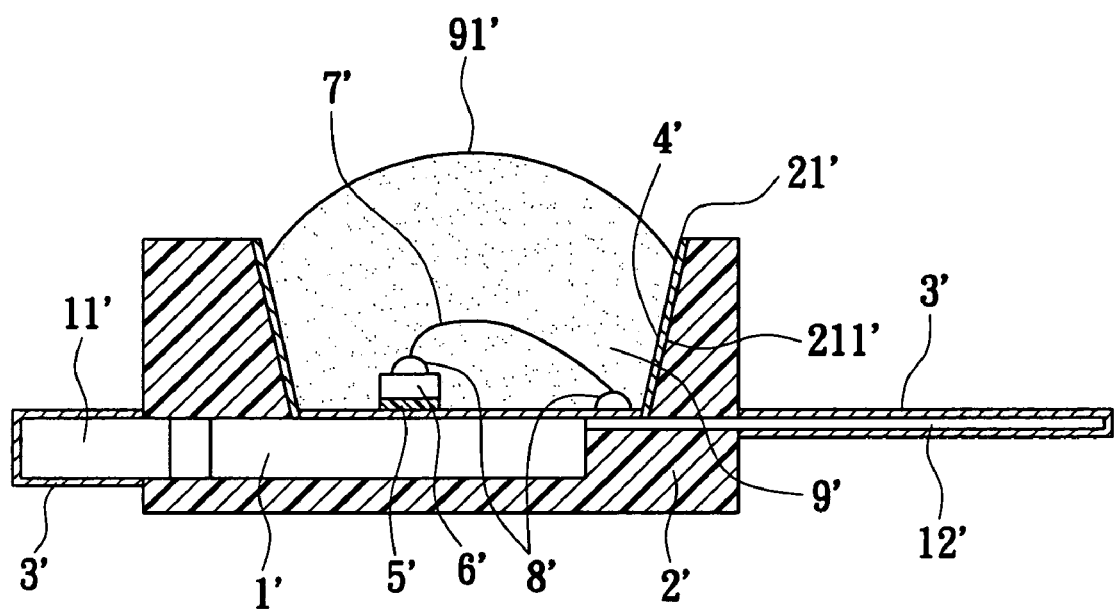
FIG. 8 is a cross-sectional view of a fifth preferred embodiment according to the present invention.
Figure 9:
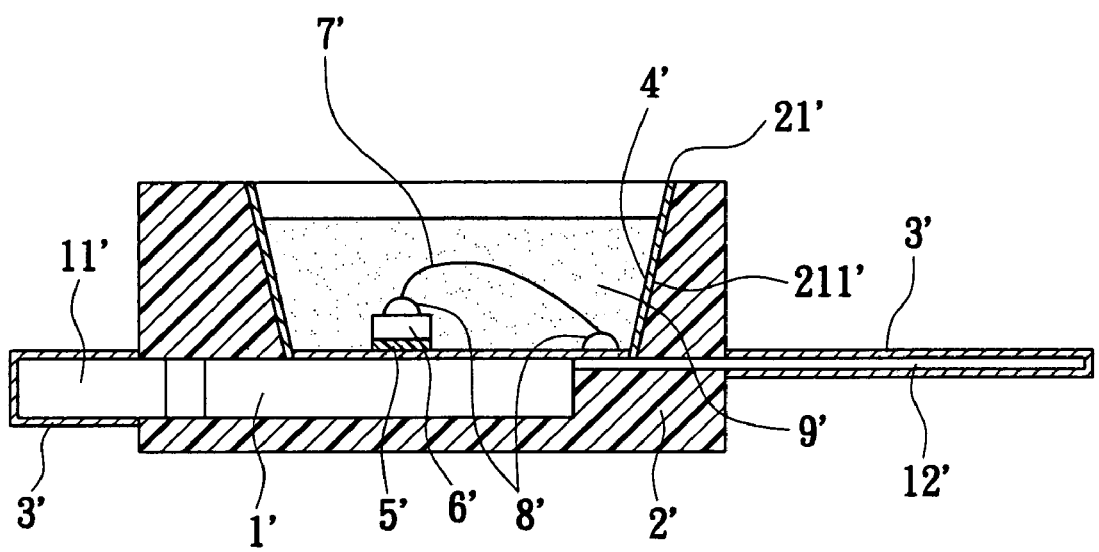
FIG. 9 is a cross-sectional view of a sixth preferred embodiment according to the present invention.

Reference is made to FIG. 6 which is a second manufacturing flowchart of a preferred embodiment according to the present invention, and references are made from FIG. 7 to FIG. 9 which are separately cross-sectional views of a fourth preferred embodiment to a sixth preferred embodiment according to the present invention. A method of manufacturing high power light-emitting device packages and structure thereof, wherein the method of manufacturing high power light-emitting device packages comprises the steps of: forming a plurality of lead frames and the lead frames are mutually connected (S200); forming an encapsulant on each of the lead frames and a reflector cup is integrally formed on each of the encapsulants (S202); electroplating each of the lead frames (S204); coating conductive gel on a bottom of the reflector cups each (S206); arranging at least one light-emitting chip inside each of the reflector cups (S208); connecting the at least one light-emitting chip with each of the lead frames by means of wire-bonding (S210); coating silver epoxy at wire-bonding connections (S212); coating silicon gel inside each of the reflector cups (S214); pressing a lens on a top of the reflector cups each (S216); and cutting off the tie-bars to separate the lead frames from one another (S218). It can be seen in the following detailed description:

First, a plurality of lead frames are formed on a metal strip with good electric conductivity and good heat conduction, and the lead frames are mutually connected by tie-bars. As shown in FIG. 7 to FIG. 9, wherein each of the lead frames 1' includes a heat-dissipating element 11' and a plurality of leads 12', and each of the leads 12' is extended outwardly from one side of the heat-dissipating element 11' (S200).

Next, an encapsulant 2' is formed on each of the lead frames 1' by means of injection molding, the encapsulant 2' is covered on a portion of the heat-dissipating element 11' and a portion of the leads 12', a reflector cup 21' is formed on the encapsulant 2' and a reflective surface 211' is formed on an inner side wall thereof, and a partial surface of the heat-dissipating element 11' and a partial surface of the leads 12' each are exposed on a bottom of the reflector cups 21' each (S202). And further, forming an electroplating layer 3' on each of uncovered surface by the encapsulant 2' of the lead frames 1' each (S204).

Next, the bottom of the reflector cups 21' each is coated conductive gel to form a conductive gel layer 5' (S206).

Next, a light-emitting chip 6' is disposed on the conductive gel layer 5' so that a bottom electrode of the light-emitting chip 6' is electrically connected with a surface of the heat-dissipating element 11' (S208).

Next, at least one top electrode of the light-emitting chip 6' is connected with one of the leads 12' by a solder wire 7' (S210).

Next, a connection location of the solder wire 7' and the at least one top electrodes of the light-emitting chip 6', and a connection location of the solder wire 7' and the one of the leads 12' are coated by silver epoxy to form a silver epoxy layer 8' for fixing the solder wire 7' (S212).

Next, each of the reflector cups 21' is coated silicon gel therein to form a silicon gel layer 9' (shown in FIG. 7) for covering the light-emitting chip 6' and the solder wire 7' (S214).

Next, a lens 10' is pressed on a top opening of the reflector cups 21' each, and the lens 10' has a focusing-light function to enhance light emitting brightness (S216).

Finally, the tie-bars are cut off to separate the lead frames 1' from one another so as to form a plurality of high power light-emitting device packages (S218).

The method of manufacturing high power light-emitting device packages stated above, wherein the step (S202) further comprises: a reflective layer 4' is plated on each of the reflective surfaces 211' (S203).

Further, in the step (S214), the silicon gel is coated inside each of the reflector cups 21' and a focusing light convex surface 91' is integrally formed on a top surface of the silicon gel (shown in FIG. 8), wherein the focusing light convex surface 91' has a focusing-light function to enhance light emitting brightness.

Furthermore, in the step (S214), the silicon gel is coated inside each of the reflector cups 21' to form a silicon gel layer 9' (shown in FIG. 9), wherein the silicon gel layer 9' has a transmitting-light function as a lens.

As shown in FIG. 7, according to the method of manufacturing stated above for manufacturing an structure of high power light-emitting device packages of the fourth preferred embodiment comprises a lead frame 1', an encapsulant 2', an electroplating layer 3', a reflective layer 4', a conductive gel layer 5', a light-emitting chip 6', a solder wire 7', a silver epoxy layer 8', a silicon gel layer 9' and a lens 10'.

The lead frames 1' includes a heat-dissipating element 11' and a plurality of leads 12', and each of the leads 12' is extended outwardly from one side of the heat-dissipating element 11'. The encapsulant 2' is covered on a portion of the heat-dissipating element 11' and a portion of the leads 12' each, a reflector cup 21' is formed on the encapsulant 2' and a reflective surface 211' is formed on an inner side wall thereof, and a partial surface of the heat-dissipating element 11' and a partial surface of the leads 12' each are exposed on a bottom of the reflector cups 21' each. The electroplating layer 3' is formed on each of uncovered surface of the lead frames 1' each. The reflective layer 4' is formed on the reflective surface 211'. The conductive gel layer 5' is coated on the bottom of the reflector cups 21' for fixing the light-emitting chip 6'. The light-emitting chip 6' is disposed on the conductive gel layer 5' so that a bottom electrode of the light-emitting chip 6' is electrically connected with a surface of the heat-dissipating element 11'. The solder wire 7' is electrically connected with a top electrode of the light-emitting chip 6' to one of the leads 12'. The silver epoxy layer 8' is formed on a connection location of the solder wire 7' and the top electrode of the light-emitting chip 6', and on a connection location of the solder wire 7' and the one of the leads 12'. The silicon gel layer 9' is formed inside the reflector cups 21' for covering the light-emitting chip 6' and the solder wire 7'. The lens 10' is disposed on a top of the reflector cups 21' each and connected with a top surface of the silicon gel layer 9'.

Further, in the fifth preferred embodiment as shown in FIG. 8, the silicon gel is coated inside each of the reflector cups 21' and a focusing light convex surface 91' is integrally formed on a top surface of the silicon gel layer 9' so that light passed through the focusing light convex surface 91' and focused to enhance light emitting brightness.

Furthermore, in the sixth preferred embodiment as shown in FIG. 9, the silicon gel is coated inside each of the reflector cups 21' to form a silicon gel layer 9', wherein the silicon gel layer 9' has transmitting-light function.

In conclusion, the method of manufacturing high power light-emitting device packages and structure of the present invention has the following advantages:

1. The lead frame includes a heat-dissipating element and a plurality of leads, and each of the leads is extended outwardly from one side of the heat-dissipating element so that the heat-dissipating element can improve heat-dissipating questions of the high power light-emitting device packages.

2. The leads fixed on an external substrate can be bent to adjust light emitting directions.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of manufacturing high power light-emitting device packages, comprising the steps of:
    (a) forming a plurality of lead frames on a metal strip, the lead frames mutually connected by tie-bars, each of the lead frames including a heat-dissipating element and a plurality of leads, and each of the leads outwardly extended from one side of the heat-dissipating element;
    (b) electroplating an outer surface of the lead frames each;
    (c) coating conductive gel on a surface of the heat-dissipating element of the lead frames each;
    (d) arranging at least one light-emitting chip on the conductive gel so that one bottom electrode of the at least one light-emitting chip electrically connected with the surface of the heat-dissipating element of the lead frames each;
    (e) forming an encapsulant on each of the lead frames by means of injection molding and the encapsulant covered on a portion of the heat-dissipating element and a portion of the leads each, a reflector cup integrally formed on the encapsulant and a reflective surface formed on an inner side wall thereof, and the at least one light-emitting chip exposed on a bottom of the reflector cups each;
    (f) connecting one top electrode of the at least one light-emitting chip with one of the leads by means of wire-bonding;

(g) coating silver epoxy at wire-bonding connections;
(h) coating silicon gel inside each of the reflector cups;
(i) pressing a lens on a top of the reflector cups each; and
(j) cutting off the tie-bars to separate the lead frames from one another, whereby forming a plurality of high power light-emitting device packages.

2. The method of manufacturing high power light-emitting device packages as claimed in claim 1, wherein the step (e) further comprising: plating a reflective layer on each of the reflective surfaces.

3. A method of manufacturing high power light-emitting device packages, comprising the steps of:
  (a) forming a plurality of lead frames on a metal strip, the lead frames mutually connected by tie-bars, each of the lead frames including a heat-dissipating element and a plurality of leads, and each of the leads outwardly extended from one side of the heat-dissipating element;
  (b) electroplating an outer surface of the lead frames each;
  (c) coating conductive gel on a surface of the heat-dissipating element of the lead frames each;
  (d) arranging at least one light-emitting chip on the conductive gel so that one bottom electrode of the at least one light-emitting chip electrically connected with the surface of the heat-dissipating element of the lead frames each;
  (e) forming an encapsulant on each of the lead frames by means of injection molding and the encapsulant covered on a portion of the heat-dissipating element and a portion of the leads each, a reflector cup integrally formed on the encapsulant and a reflective surface formed on an inner side wall thereof, and the at least one light-emitting chip exposed on a bottom of the reflector cups each;
  (f) connecting one top electrode of the at least one light-emitting chip with one of the leads by means of wire-bonding;
  (g) coating silver epoxy at wire-bonding connections;
  (h) coating silicon gel inside each of the reflector cups; and
  (i) cutting off the tie-bars to separate the lead frames from one another, whereby forming a plurality of high power light-emitting device packages.

4. The method of manufacturing high power light-emitting device packages as claimed in claim 3, wherein the step (e) further comprising: plating a reflective layer on each of the reflective surfaces.

5. The method of manufacturing high power light-emitting device packages as claimed in claim 3, wherein the step (h) further comprising: after coating silicon gel inside each of the reflector cups, a focusing light convex surface integrally formed on a top surface of the silicon gel.

6. A method of manufacturing high power light-emitting device packages, comprising the steps of:
  (a) forming a plurality of lead frames on a metal strip, the lead frames mutually connected by tie-bars, each of the lead frames including a heat-dissipating element and a plurality of leads, and each of the leads outwardly extended from one side of the heat-dissipating element;
  (b) forming an encapsulant on each of the lead frames by means of injection molding and the encapsulant covered on a portion of the heat-dissipating element and a portion of the leads each, a reflector cup integrally formed on the encapsulant and a reflective surface formed on an inner side wall thereof, and a partial surface of the heat-dissipating element and a partial surface of the leads each exposed on a bottom of the reflector cups each;
  (c) electroplating an outer surface of the lead frames each uncovered by the encapsulant;
  (d) coating conductive gel on a bottom of the reflector cups each;
  (e) arranging at least one light-emitting chip on the conductive gel so that one bottom electrode of the at least one light-emitting chip electrically connected with a surface of the heat-dissipating element of the lead frames each;
  (f) connecting one top electrode of the at least one light-emitting chip with one of the leads by means of wire-bonding way;
  (g) coating silver epoxy at wire-bonding connections;
  (h) coating silicon gel inside each of the reflector cups;
  (i) pressing a lens on a top of the reflector cups each; and
  (j) cutting off the tie-bars to separate the lead frames from one another, whereby forming a plurality of high power light-emitting device packages.

7. The method of manufacturing high power light-emitting device packages as claimed in claim 6, wherein the step (b) further comprising: plating a reflective layer on each of the reflective surfaces.

8. A method of manufacturing high power light-emitting device packages, comprising the steps of:
  (a) forming a plurality of lead frames on a metal strip, the lead frames mutually connected by tie-bars, each of the lead frames including a heat-dissipating element and a plurality of leads, and each of the leads outwardly extended from one side of the heat-dissipating element;
  (b) forming an encapsulant on each of the lead frames by means of injection molding and the encapsulant covered on a portion of the heat-dissipating element and a portion of the leads each, a reflector cup integrally formed on the encapsulant and a reflective surface formed on an inner side wall thereof, and a partial surface of the heat-dissipating element and a partial surface of the leads each exposed on a bottom of the reflector cups each;
  (c) electroplating an outer surface of the lead frames each uncovered by the encapsulant;
  (d) coating conductive gel on a bottom of the reflector cups each;
  (e) arranging at least one light-emitting chip on the conductive gel so that one bottom electrode of the at least one light-emitting chip electrically connected with a surface of the heat-dissipating element of the lead frames each;
  (f) connecting one top electrode of the at least one light-emitting chip with one of the leads by means of wire-bonding;
  (g) coating silver epoxy at wire-bonding connections;
  (h) coating silicon gel inside each of the reflector cups; and
  (i) cutting off the tie-bars to separate the lead frames from one another, whereby forming a plurality of high power light-emitting device packages.

9. The method of manufacturing high power light-emitting device packages as claimed in claim 8, wherein the step (b) further comprising: plating a reflective layer on each of the reflective surfaces.

10. The method of manufacturing high power light-emitting device packages as claimed in claim 8, wherein the step (h) further comprising: after coating silicon gel inside each of the reflector cups, a focusing light convex surface further integrally formed on a top surface of the silicon gel.

* * * * *